United States Patent
Wood et al.

(10) Patent No.: US 7,079,972 B1
(45) Date of Patent: Jul. 18, 2006

(54) APPARATUS AND METHOD FOR TEMPERATURE CONTROL OF INTEGRATED CIRCUITS

(75) Inventors: Peter R. Wood, Los Altos, CA (US); Narc V. Peralta, Union City, CA (US); Frank S. Madren, Los Gatos, CA (US); Dileep Sivasankaran, Fremont, CA (US)

(73) Assignee: GarrettCom, Inc, Fremont, CA (US)

( * ) Notice: Subject to any disclaimer, the term of this patent is extended or adjusted under 35 U.S.C. 154(b) by 111 days.

(21) Appl. No.: 10/649,371

(22) Filed: Aug. 27, 2003

Related U.S. Application Data

(60) Provisional application No. 60/418,897, filed on Oct. 15, 2002.

(51) Int. Cl.
*G01R 27/28* (2006.01)
*G01R 21/02* (2006.01)

(52) U.S. Cl. ..................... 702/117; 324/760
(58) Field of Classification Search ............... 702/117, 702/120, 130; 219/208, 209, 497, 501, 505, 219/388, 494, 481; 324/755–760, 765, 537; 165/80.2, 80.3, 80.4; 374/102; 347/17, 347/18, 56, 60
See application file for complete search history.

(56) References Cited

U.S. PATENT DOCUMENTS

| | | | | |
|---|---|---|---|---|
| 4,860,166 A | * | 8/1989 | Nicholls | 361/792 |
| 5,638,097 A | * | 6/1997 | Takayanagi et al. | 347/7 |
| 5,844,208 A | * | 12/1998 | Tustaniwskyj et al. | 219/494 |
| 5,889,462 A | * | 3/1999 | Rana et al. | 338/254 |
| 6,476,508 B1 | | 11/2002 | Strnad | |
| 6,510,400 B1 | | 1/2003 | Moriyama | |
| 2005/0122689 A1 | | 6/2005 | Pozzuoli | |
| 2006/0007614 A1 | | 1/2006 | Pozzouli et al. | |

OTHER PUBLICATIONS

LM56 Dual Output Low Power Thermostat, pp. 1-12; 2001 National Semiconductor Corporation.

* cited by examiner

*Primary Examiner*—Bryan Bui
*Assistant Examiner*—Meagan S Walling
(74) *Attorney, Agent, or Firm*—Okamoto & Benedicto LLP

(57) ABSTRACT

One embodiment disclosed relates to an apparatus for temperature control of an integrated circuit on a circuit board. The apparatus includes a first resistor on the circuit board, a second resistor on the circuit board, and a heat conductive material. The heat conductive material is attached to both the first and second resistors and to a surface of a package containing the integrated circuit. Another embodiment disclosed relates to an apparatus that provides both cooling and heating functionality in order to maintain the operational temperature of the IC within an acceptable range.

20 Claims, 4 Drawing Sheets

(Elevation View)

(Plan View)

(Elevation View)

APPARATUS AND METHOD FOR TEMPERATURE CONTROL OF INTEGRATED CIRCUITS

RELATED APPLICATIONS

The present application claims the benefit of U.S. provisional patent application No. 60/418,897, filed Oct. 15, 2002, entitled "System and method for operation of ethernet LAN products at extended high and low temperatures for temperature-uncontrolled outdoor applications," by Peter R. Wood; Narc V. Peralta; Frank S. Madren; and Dileep Sivasankaran, the disclosure of which is hereby incorporated by reference in its entirety.

BACKGROUND OF THE INVENTION

1. Field of the Invention

The present invention relates generally to electronic systems. More particularly, the present invention relates to controlling the operating temperature of electronic components.

2. Description of the Background Art

As device sizes continue to shrink into the submicron region, packing densities have increased dramatically. One consequence of this heightened density is that the thermal energy generated by the operation of semiconducting devices is a significant factor that must be considered in designing an integrated circuit. Absent some form of heat management, heat from device operation would accumulate and degrade device performance or result in device failure. For example, conventionally, in order to prevent breakage and operational failure of a central processing unit (CPU), the CPU is typically cooled using a forced-air cooling fan and a heat sink.

While such cooling and heat dissipation mechanisms are important for typical applications of integrated circuits, they are insufficient for certain applications where cooling and heat dissipation alone cannot provide proper temperature control.

SUMMARY

One embodiment of the invention pertains to a method using both heat generation and heat dissipation for temperature control of an integrated circuit on a circuit board. A package containing the integrated circuit is heated using a heating element thermally coupled to the package. In addition, heat is dissipated from the package using a heat sink also thermally coupled to the package.

Another embodiment of the invention pertains to an apparatus for temperature control of an integrated circuit on a circuit board. The apparatus includes a first resistor on the circuit board, a second resistor on the circuit board, and a heat conductive material. The heat conductive material is attached to both the first and second resistors and to a surface of a package containing the integrated circuit.

Another embodiment of the invention pertains to a method for temperature control of an integrated circuit on a circuit board. An electrical current flowing through one or more resistive element is controlled so as to control generation of heat therefrom. The generated heat is conducted by way of a heat conductive element from the resistive element(s) to a surface of a package containing the integrated circuit.

Another embodiment of the invention pertains to an apparatus including a heater element, a temperature sensor, and a controller. The heater element and the temperature sensor are both thermally coupled to a surface of the body containing the integrated circuit. The controller is configured to receive temperature data from the temperature sensor and to use the temperature data to control heat generation by the heater element.

DETAILED DESCRIPTION

As discussed above, conventional techniques are typically focused on cooling integrated circuits (ICs) to avoid overheating. However, in some operational environments, the conventional techniques are inadequate to maintain an IC within its operational limits.

Typical commercial ICs have a normal range of operation of roughly from zero degrees to seventy degrees Celsius, or thereabouts. Embodiments of the present invention may be utilized to effectively extend the operating temperature ranges of commercial or industrial ICs. For example, embodiments of the present invention may be applied to a commercial IC of an Ethernet hub or other device in a temperature-uncontrolled environment, such as the top of a cell tower, in an outdoor cable hub, on a telephone booth, in an underground mine, in a factory, or other such environment. Specific applications include implementing outdoor IEEE 802.11 access points, outdoor video surveillance, outdoor communications using power line based technologies, space communications, and so on.

Embodiments of the present invention are designed to control the temperature of ICs in various operational environments. For example, if the operating temperature of an IC drops too low, performance of the IC slows or the IC may fail. Similarly, if the operating temperature of an IC goes too high, error or failure may occur. One aspect of the present invention relates to an apparatus that provides both cooling and heating functionality in order to maintain the operational temperature of the IC within an acceptable range.

Figure 1:
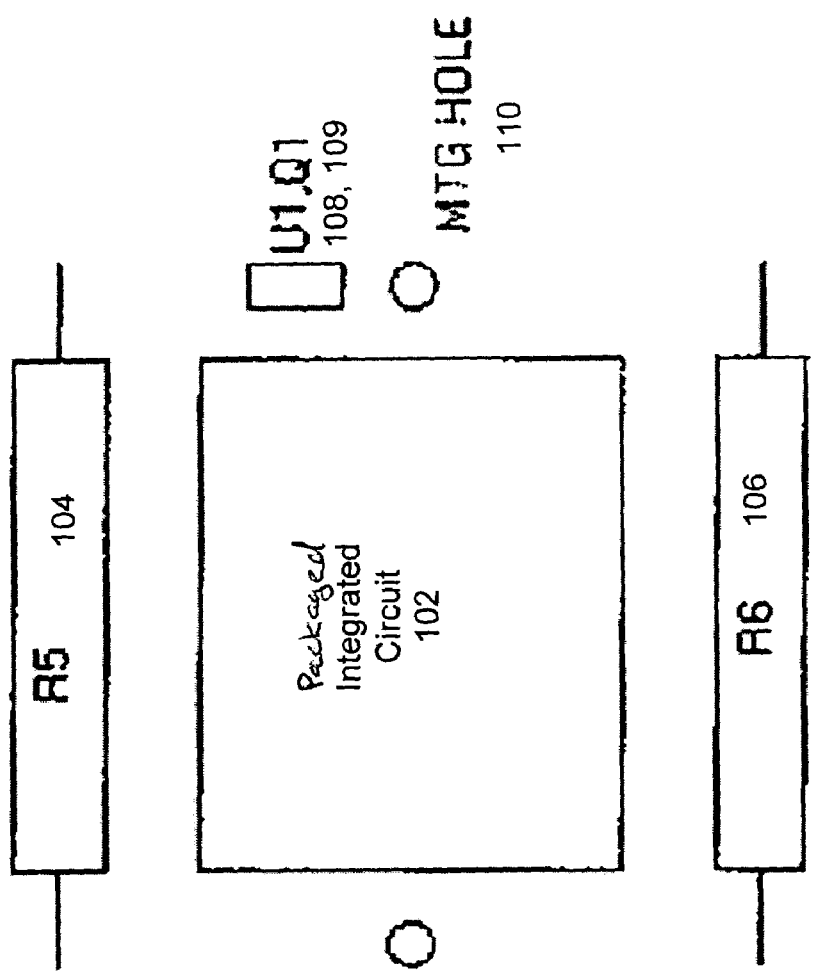
FIG. 1 depicts a layout for an apparatus for temperature control of an integrated circuit on a circuit board in accordance with an embodiment of the invention.

FIG. 1 depicts a layout (plan view) for an apparatus for temperature control of an integrated circuit (IC) 102 on a circuit board in accordance with an embodiment of the invention. The IC 102 may comprise a CPU, a network processor, a microcontroller, or other integrated circuit device. The IC itself is contained in a package. The package is coupled to the circuit board by way of a socket or other appropriate connector. For example, the package may comprise a dual in-line package, a pin grid array, a ball grid array, or other package type.

In accordance with this embodiment, one or more resistor or resistive element is attached to the circuit board in proximity to the packaged IC 102. In the particular configuration illustrated, the resistors or resistive elements R5 104 and R6 106 are placed on opposite sides of the packaged IC 102. Also indicated in the layout are a temperature controller component U1 108 and a transistor component Q1 109. The interconnections and operations between these various components are described further below. Also depicted are a couple of mounting holes 110 for attaching an optional part to the assembly to enclose the area for efficiency.

Figure 2:
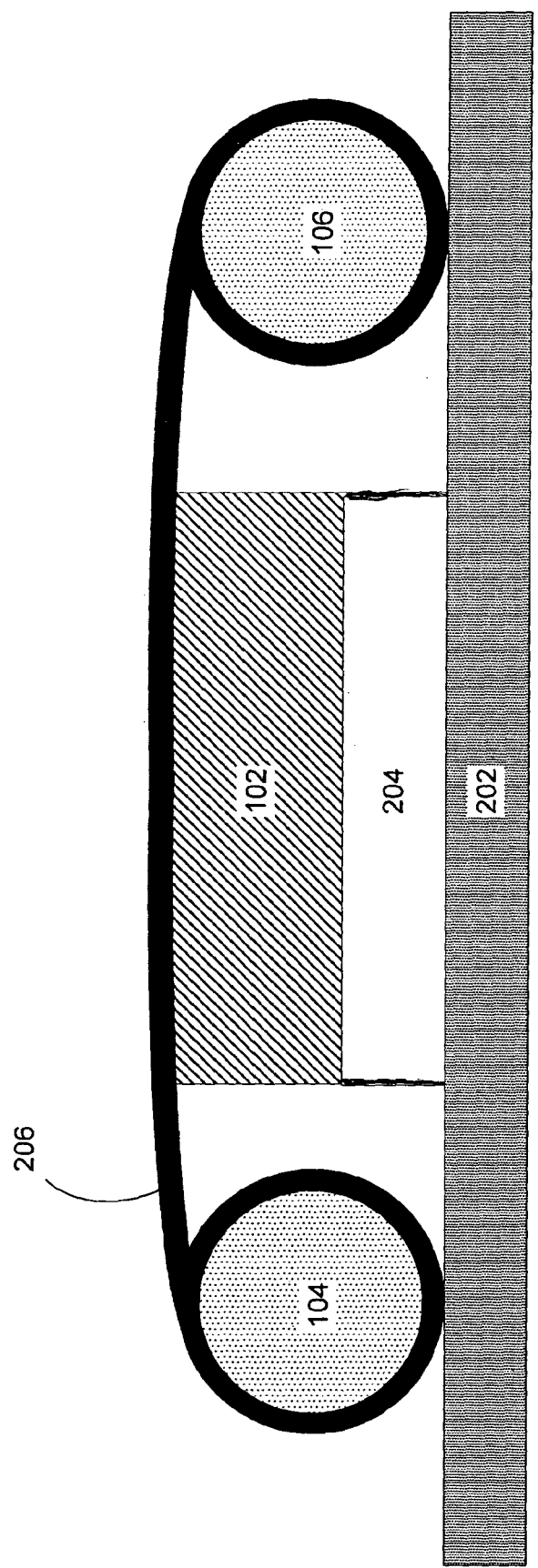
FIG. 2 depicts an elevation view of an apparatus for temperature control of an integrated circuit on a circuit board in accordance with an embodiment of the invention.

FIG. 2 depicts an elevation view of an apparatus for temperature control of an integrated circuit 102 on a circuit board 202 in accordance with an embodiment of the invention. A socket or other connector 204 is mounted on the circuit board 202. The connector 204 is used to couple the packaged IC 102 to the circuit board 202. Cross-sections of the two resistors 104 and 106 are shown. In this implementation, the resistors 104 and 106 are located on opposite sides of the IC 102. A heat conductive material 206 is attached to both the first 104 and second 106 resistors and to a top surface of the packaged IC 102. The heat conductive material 206 may comprise a metal ribbon, such as a copper ribbon or an aluminum ribbon. The metal ribbon may be wrapped around each of the first 104 and second 106 resistors as shown. This wrapping is advantageous in promoting efficient heat transfer from the resistors and enables inexpensive resistors to be utilized as heating elements. The metal ribbon may be attached to the top surface of the packaged IC 102 using, for example, a thermal adhesive.

In another embodiment, the heat conductive material 206 may couple to the IC 102 by way of a different surface other than the top surface. For example, the heat conductive material 206 may be configured such that it transfers heat from a bottom surface of the IC 102. For example, with a Dual In-line Pin (DIP) packaged chip, the heat conductive material 206 may be routed between the DIP and the circuit board. As another example, the heat conductive material 206 may be configured to transfer heat from the side surfaces of the IC 102.

Figure 3:
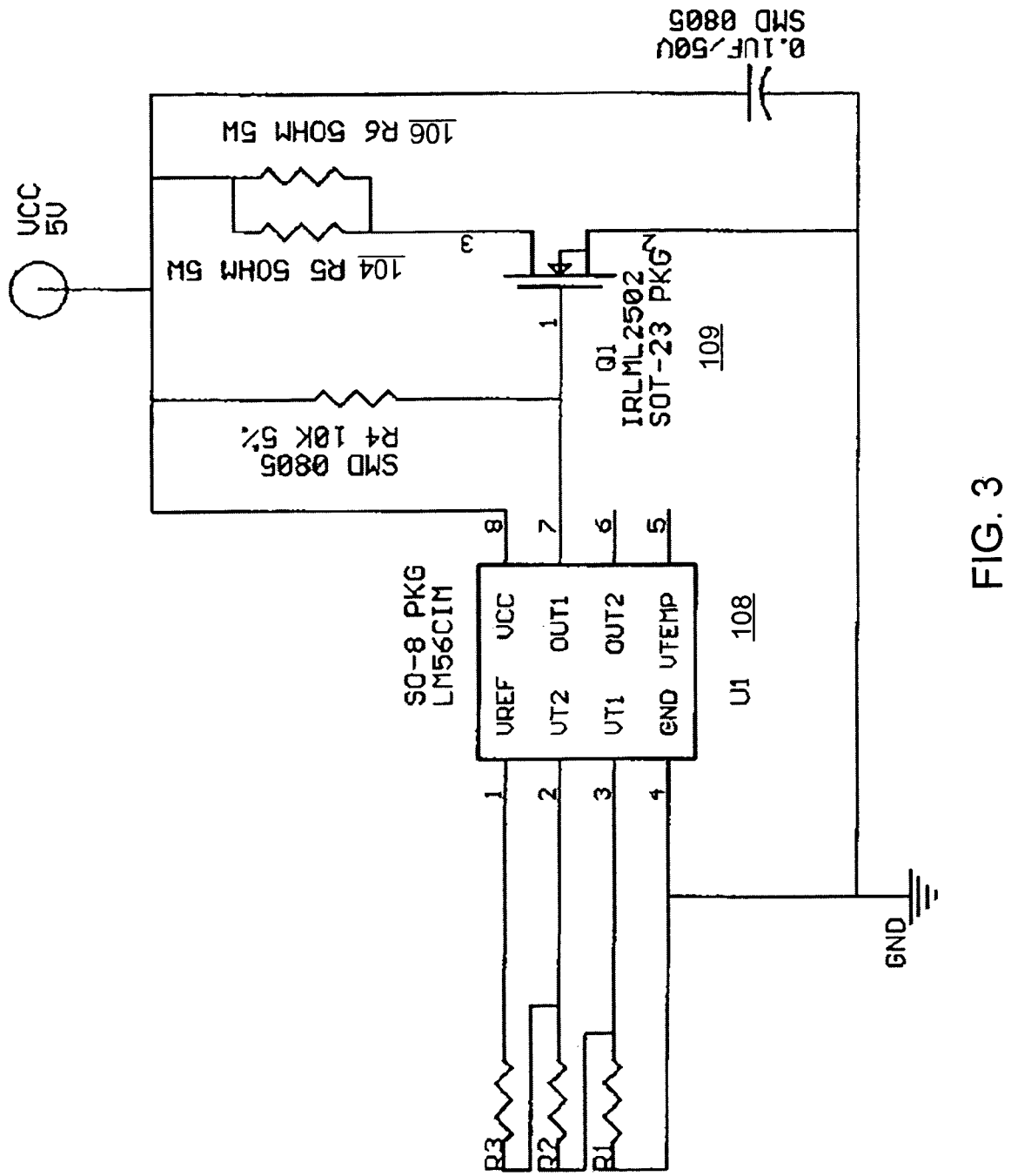
FIG. 3 depicts a circuit schematic for an apparatus for temperature control of an integrated circuit on a circuit board in accordance with an embodiment of the invention.

FIG. 3 depicts a circuit schematic for an apparatus for temperature control of an integrated circuit on a circuit board in accordance with an embodiment of the invention. The circuitry includes components depicted in FIG. 1, such as the first R5 104 and second R6 106 resistors, the controller U1 108, and the transistor Q1 109. Other components are also included.

The controller U1 108 may be implemented, for example, using a thermostat control device such as the LM 56 Dual Output Low Power Thermostat available from National Semiconductor Corporation. The LM 56 includes eight pins. VREF (pin 1) is a voltage reference output pin. GND (pin 4) is electrical ground pin, and VCC is the positive voltage supply pin (pin 8). VT2 (pin 2) is an input pin for the low temperature trip point voltage for OUT2 (pin 6), and VT1 (pin 3) is an input pin for the temperature trip point voltage for OUT1 (pin 7). VTEMP (pin 5) is the temperature sensor output pin. OUT1 and OUT2 are open collector digital outputs. OUT1 is active low and goes low when the temperature is greater than a temperature T1 set by VT1 and goes high when the temperature drops below T1 minus 5 degrees Celsius. OUT2 is active low and goes low when the temperature is greater than a temperature T2 set by VT2 and goes high when the temperature is less than T2 minus 5 degrees Celsius. The values of the resistors R1, R2, and R3 are selected to set T1 and T2 to the desired temperature levels. The LM56 includes an internal temperature sensor.

In this application of the LM56, OUT1 is used to control the transistor Q1 109. When the temperature sensed drops below about T1 minus 5 degrees Celsius, OUT1 goes high and so "turns on" the transistor Q1 109. In this state, electrical current flows from VCC, through the resistors R5 104 and R6 106, through Q1 109, to ground. With electrical current flowing through the resistors R5 104 and R6 106, heat is generated therefrom. The heat is conducted by the heat conductive material 206 from the resistors R5 104 and R6 106 to the top of the IC package 102. When the temperature of the IC 102 increases such that the temperature sensed goes above T1, then OUT1 goes low and so "turns off" the transistor Q1 109. In this state, electrical current stops flowing through the resistors R5 104 and R6 106, and so the heat generation stops.

Note that much of the temperature sensed by the internal sensor is due to the temperature at the leads (pins). Hence, the LM56 should be configured such that the temperature at the leads of the LM56 is close to, or reflects changes in, the temperature of the IC 102.

A different embodiment may be based on a different thermostat controller device 108. An external sensor that is more closely coupled thermally to the IC 102 may also be utilized.

Figure 4:
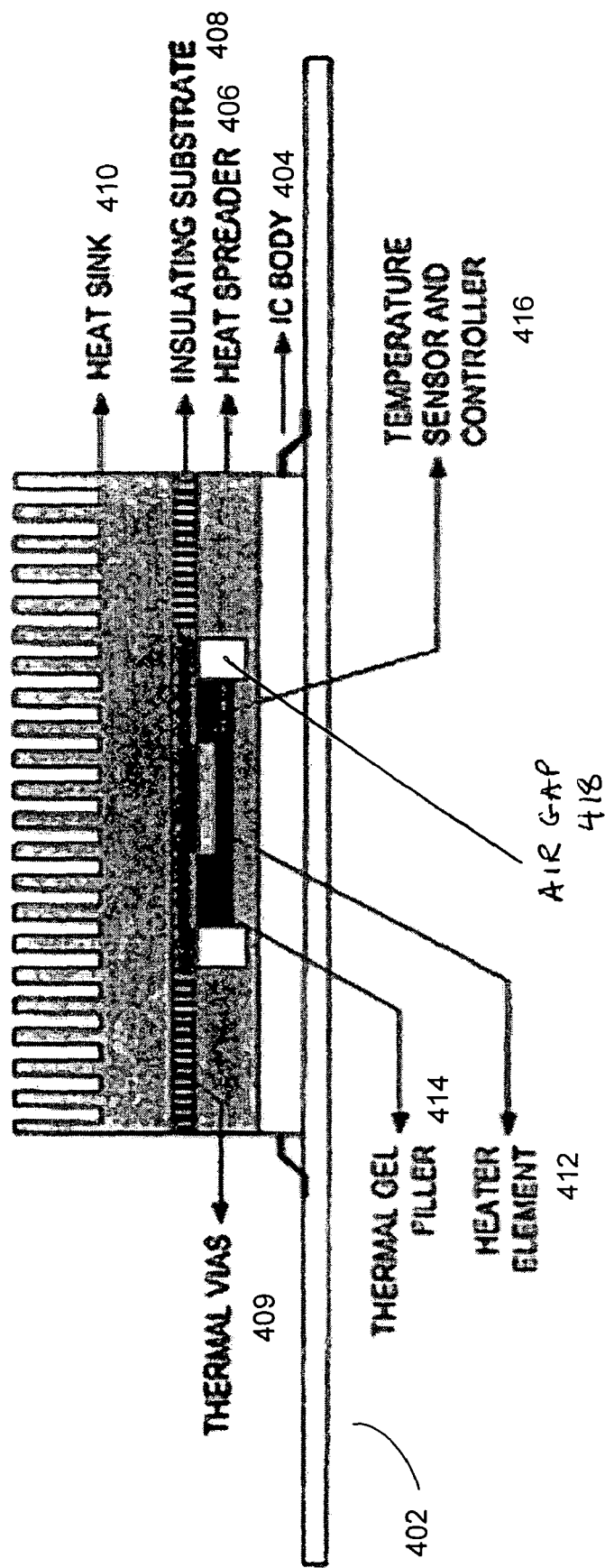
FIG. 4 depicts an elevation view of an apparatus for temperature control of an integrated circuit on a circuit board in accordance with another embodiment of the invention.

FIG. 4 depicts an elevation view of an apparatus for temperature control of an integrated circuit 404 on a circuit board 402 in accordance with another embodiment of the invention. Here, the IC body 404 is shown mounted on the board 402. A heat spreader 406 is attached to the top of the IC body 402, and an insulating substrate 408 is attached to the top of the heat spreader 406. Attached to the top of the insulating substrate 408 is a heat sink 410. The heat sink 410 is thermally coupled to the heat spreader 406 by way of thermal vias or passageways 409 through the insulating substrate 408 and is used for efficient dissipation of heat therefrom. These thermal vias 409 are filled with a conductive material, such as aluminum or another metal.

In this embodiment, the heat spreader 406 is configured such that there is a cavity therein facing the insulating substrate 408. The cavity is separated from the IC body 404 by a relatively thinner portion of the heat spreader 406. Within an inner portion of the cavity, attached to the insulating substrate is a heater element 412. Also within the inner portion, closer to the heat spreader 406, is a temperature sensor and associated controller 416. Two external wires, power and ground, may be coupled to these devices within the cavity to enable their operation. An optional third external wire may be coupled to the controller for purposes of remote control of the heater (or for programming memory associated with the controller). The controller is configured with circuitry to receive temperature data from the temperature sensor and to use the temperature data to control heat generation from the heater element 412. A thermal gel filler 414 may be used to fill the remaining space in the inner portion and may be confined to the inner portion. The thermal gel filler 414 thermally couples the heater element 412 and the temperature sensor to the IC body 402. An outer portion of the cavity may comprise an air gap 418 that provides some thermal separation.

The heater element 412 is attached to a bottom surface of the insulating substrate 408 at a location so as to be separated from the thermal vias 409. This is advantageous in that more of the heat generated by the heating element 412 is conducted by the thin portion of the heater spreader 406 to the IC body 404 and less of the heat generated is conducted by the thermal vias 409 to the heat sink 410. In other words, this configuration provides at least partial thermal separation of the heater element 412 from the heat sink 410 by the insulating substrate 408 such that heat generated by the heating element 412 is primarily directed towards the IC body 404 and not towards the heat sink 410.

In accordance with another embodiment of the invention, programmable memory (for example, flash memory, EPROM, EAPROM, or other form of programmable memory) may be included with the controller. The programmable memory may be programmed so as to provide for customized control characteristics that depend on the specific application. For example, the memory may be programmed to hold information about the boundary temperatures to be used by the temperature controller. With such programmable memory included, customization of the packages may be performed even after product assembly if the package includes a programming interface.

In accordance with another embodiment, the controller device may be configured to provide initial heating of an IC during a cold start of a system. In other words, the controller would be configured such that heat is generated to warm up a system prior to power being applied to the IC. In certain circumstances, such warming up of the IC may be used to evaporate moisture that may have condensed thereon.

In accordance with another embodiment, the IC may be encapsulated with a sealed environment. Such an embodiment may be useful in a corrosive atmosphere, for example, one in which hydrogen sulfide gas is present as in a copper mine. Encapsulation may also be advantageous in high altitude airplane or space applications.

Embodiments of the present invention are suitable to control the temperature of integrated circuits in various unfriendly environments. Otherwise, if the temperature drops too low, performance of the IC slows or the IC may fail. Typical commercial ICs have a normal range of operation of roughly from 0 degrees to 70 degrees Celsius, or thereabouts. Embodiments of the present invention may be utilized to extend the temperature range of environments in which commercial or industrial ICs operate. For example, the above-described embodiments may be applied to a commercial IC of an Ethernet hub or other device in a temperature-uncontrolled environment, such as the top of a cell tower, in an outdoor cable hub, on a telephone booth, in an underground mine, in a factory, or other harsh environment. Specific applications include implementing outdoor IEEE 802.11 access points, outdoor video surveillance, outdoor communications using power line based technologies, space communications, and so on.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for temperature control of an integrated circuit on a circuit board, the apparatus comprising:
    a first resistor on the circuit board;
    a second resistor on the circuit board; and
    a heat conductive material attached to both the first and second resistors and to a surface of a package containing the integrated circuit,
    wherein the heat conductive material is configured between the integrated circuit and the circuit board, and
    wherein the first resistor is configured on one side of the integrated circuit on the circuit board, and wherein the second resistor is configured on an opposite side of the integrated circuit on the circuit board.

2. An apparatus for temperature control of an integrated circuit on a circuit board, the apparatus comprising:
    a first resistor on the circuit board;
    a second resistor on the circuit board; and
    a heat conductive material attached to both the first and second resistors and to a surface of a package containing the integrated circuit,
    wherein the heat conductive material comprises a metal ribbon, and
    wherein the metal ribbon is wrapped around each of the first and second resistors.

3. The apparatus of claim 2, wherein the metal ribbon is attached with a thermal adhesive to the top surface of the packaged integrated circuit.

4. The apparatus of claim 3, wherein the metal ribbon comprises a copper ribbon.

5. The apparatus of claim 3, wherein the metal ribbon comprises an aluminum ribbon.

6. An apparatus for temperature control of an integrated circuit on a circuit board, the apparatus comprising:
    a first resistor on the circuit board;
    a second resistor on the circuit board; and
    a heat conductive material attached to both the first and second resistors and to a surface of a package containing the integrated circuit; and
    a temperature controller configured to control electrical current through the two resistors,
    wherein the heat conductive material is configured between the integrated circuit and the circuit board.

7. The apparatus of claim 6, further comprising:
    a temperature sensor configured to measure a temperature of the integrated circuit and to provide the temperature measurement to the temperature controller,
    wherein the temperature controller uses the temperature measurement as feedback data in controlling the electrical current through the two resistors.

8. An apparatus for temperature control of an integrated circuit on a circuit board, the apparatus comprising:
    a first resistor on the circuit board;
    a second resistor on the circuit board;
    a heat conductive material attached to both the first and second resistors and to a surface of a package containing the integrated circuit;
    a temperature controller configured to control electrical current through the two resistors;
    a voltage source coupled to one end of the resistors; and
    at least one transistor coupled to another end of the resistors, wherein the electrical current is controlled controlling an electrical current flowing through the transistor(s).

9. A method for temperature control of an integrated circuit on a circuit board, the method comprising:

controlling an electrical current flowing through one or more resistive element so as to control generation of heat therefrom;

conducting the generated heat by way of a heat conductive element from the resistive element(s) to a package containing the integrated circuit;

sensing a temperature of the integrated circuit by way of a temperature sensor;

providing the temperature as feedback control data to a controller; and utilization of the feedback control data by the controller in controlling the electrical current flowing through the resistive element(s), wherein the method is applied to provide pre-heating of the integrated circuit, prior to application of power to the integrated circuit.

10. The method of claim 9, wherein the method is applied in a temperature-uncontrolled environment.

11. An apparatus for temperature control of an integrated circuit on a circuit board, the apparatus comprising:

a heater element thermally coupled to a top surface of a body containing the integrated circuit (the IC body);

a temperature sensor thermally coupled to the IC body;

a controller configured to receive temperature data from the temperature sensor and to use the temperature data to control heat generation by the heater element; and a heat spreader configured between the top surface of the IC body and the heater element.

12. The apparatus of claim 11, further comprising:

a heat sink thermally coupled to the heat spreader for efficient dissipation of heat therefrom.

13. The apparatus of claim 12, further comprising:

an insulating substrate configured between the heat spreader and the heat sink, wherein the insulating substrate includes thermal vias to thermally couple the heat spreader to the heat sink.

14. The apparatus of claim 13, wherein the heating element is attached to a bottom surface of the insulating substrate at a location so as to be separated from the thermal vias.

15. The apparatus of claim 14, wherein thermal gel filler is used to thermally couple the heating element to the heat spreader but not directly to any of the thermal vias.

16. The apparatus of claim 11, wherein the integrated circuit is encapsulated with a sealed environment.

17. A method for temperature control of an integrated circuit on a circuit board, the method comprising:

heating a first surface of a package containing the integrated circuit using a heating element thermally coupled to the first surface; and dissipating heat from a second surface using a heat sink thermally coupled to the second surface, wherein the heating element is at least partially thermally separated from the heat sink by an insulating substrate such that heat generated from the heating element is primarily directed towards the integrated circuit and not towards the heat sink.

18. The method of claim 17, wherein the first and second surfaces both comprise a top surface of the packaged integrated circuit.

19. The method of claim 17, further comprising:

measuring a temperature of the integrated circuit; and using the temperature measurement in controlling the heating element.

20. The method of claim 19, further comprising:

using programmable memory to hold at least one boundary temperature to be used in the control of the heating element.

* * * * *